(12) United States Patent
Hane et al.

(10) Patent No.: US 10,550,470 B2
(45) Date of Patent: Feb. 4, 2020

(54) FILM FORMING APPARATUS AND OPERATION METHOD OF FILM FORMING APPARATUS

(71) Applicant: TOKYO ELECTRON LIMITED, Tokyo (JP)

(72) Inventors: Hideomi Hane, Nirasaki (JP); Kentaro Oshimo, Nirasaki (JP); Shimon Otsuki, Oshu (JP); Takeshi Oyama, Niraskai (JP); Hiroaki Ikegawa, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/171,667

(22) Filed: Oct. 26, 2018

(65) Prior Publication Data
US 2019/0127849 A1    May 2, 2019

(30) Foreign Application Priority Data
Oct. 27, 2017 (JP) .................. 2017-208566

(51) Int. Cl.
*C23C 16/34* (2006.01)
*C23C 16/455* (2006.01)
(Continued)

(52) U.S. Cl.
CPC ...... *C23C 16/45544* (2013.01); *C23C 16/345* (2013.01); *C23C 16/4584* (2013.01); *C23C 16/45536* (2013.01); *C23C 16/45565* (2013.01); *C23C 16/46* (2013.01); *H01L 21/0217* (2013.01); *H01L 21/0228* (2013.01); *H01L 21/02274* (2013.01); *H01L 21/68764* (2013.01)

(58) Field of Classification Search
CPC ............. C23C 16/45544; C23C 16/46; C23C 16/45565; C23C 16/4584; C23C 16/345; C23C 16/45536; H01L 21/02274; H01L 21/0217; H01L 21/68764; H01L 21/0228; H01L 21/02211; H01L 21/68771; H01L 21/67109
See application file for complete search history.

(56) References Cited

U.S. PATENT DOCUMENTS

2002/0167781 A1*  11/2002  Matsuki ............ H01L 21/67017
                                                          361/234

FOREIGN PATENT DOCUMENTS

JP    2014-199856 A    10/2014
JP    2016-122778 A    7/2016

* cited by examiner

*Primary Examiner* — Kyoung Lee
(74) *Attorney, Agent, or Firm* — Nath, Goldberg & Meyer; Jerald L. Meyer

(57) ABSTRACT

There is provided a film forming apparatus for performing a film forming process by supplying a film forming gas to a substrate in a vacuum atmosphere, comprising: a processing container in which a mounting part for mounting a substrate thereon is provided; a heating part configured to heat the substrate mounted on the mounting part; an exhaust part configured to evacuate an inside of the processing container; a cooling gas supply part configured to supply a cooling gas into the processing container; a purge gas supply part configured to supply a purge gas into the processing container; and a control part configured to output a control signal so as to execute a step of applying a stress to a thin film formed inside the processing container.

10 Claims, 11 Drawing Sheets

(51) Int. Cl.
*C23C 16/458* (2006.01)
*H01L 21/02* (2006.01)
*H01L 21/687* (2006.01)
*C23C 16/46* (2006.01)

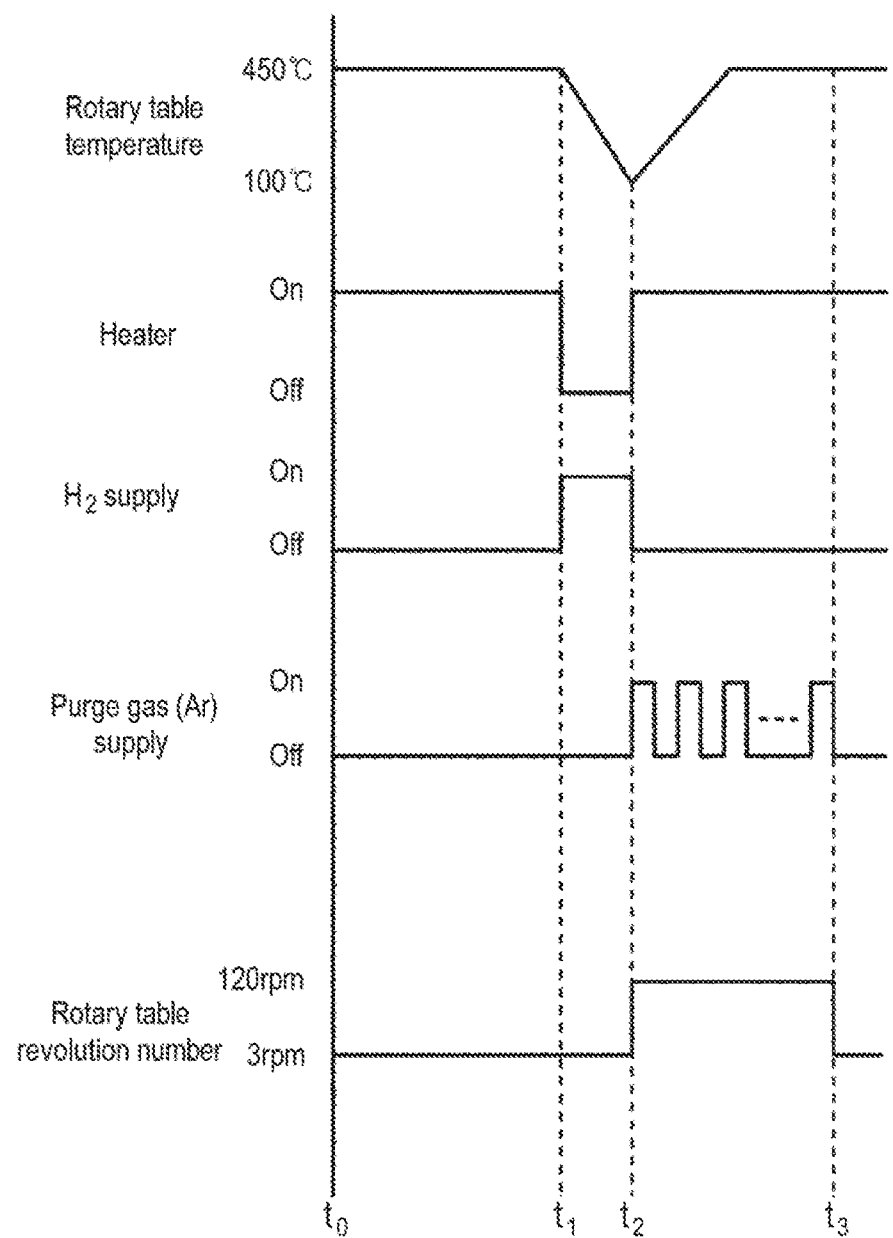

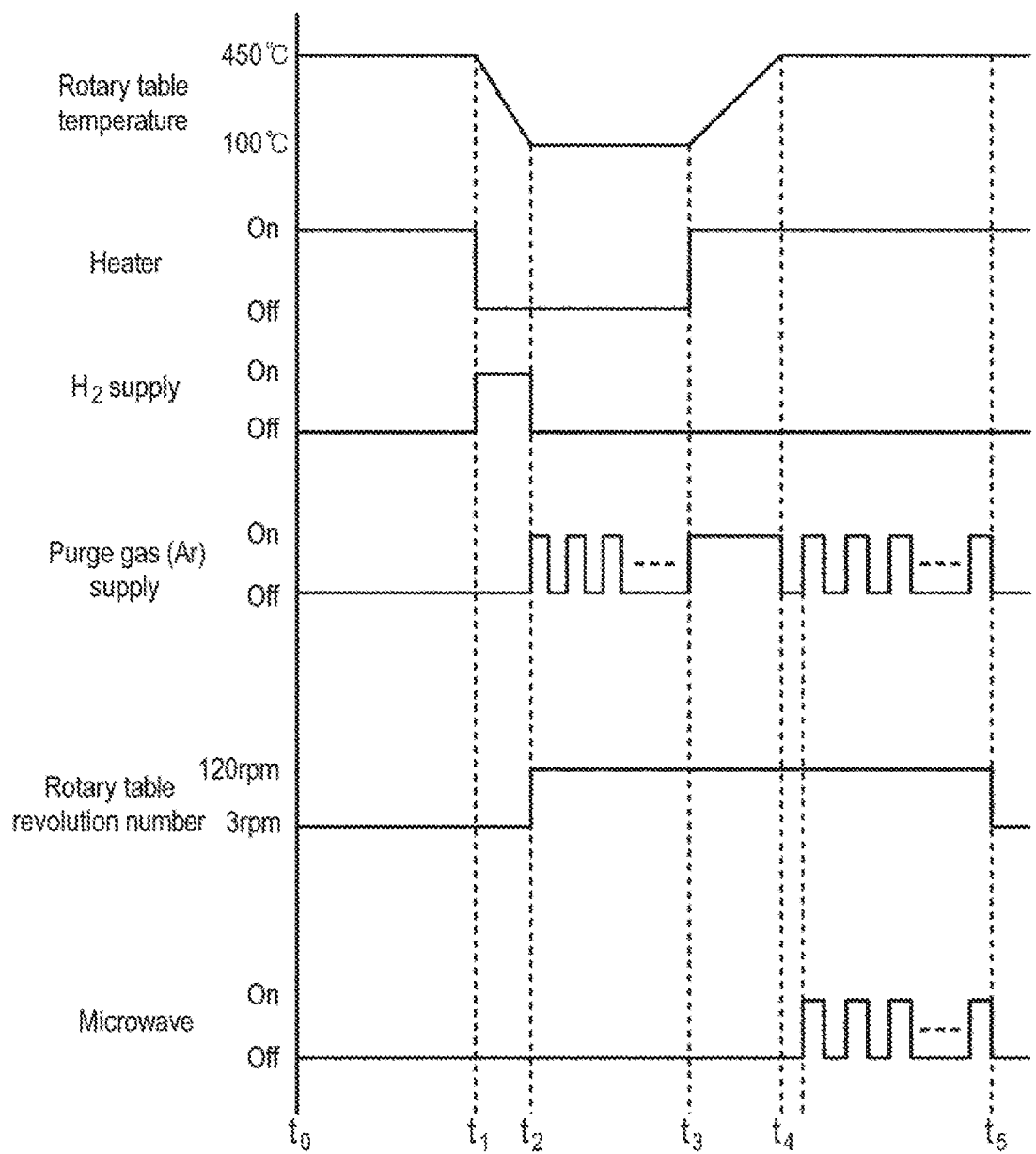

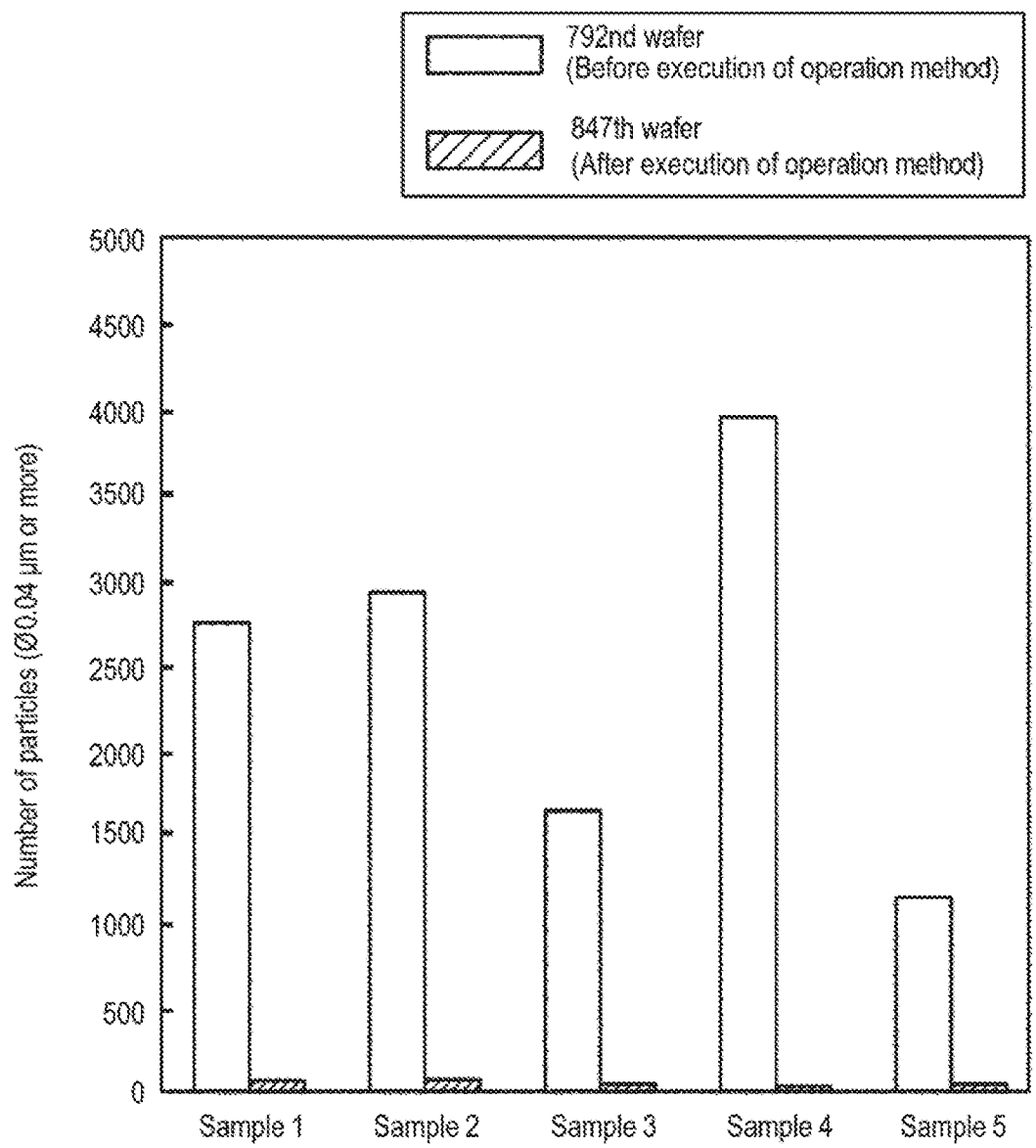

FILM FORMING APPARATUS AND OPERATION METHOD OF FILM FORMING APPARATUS

CROSS-REFERENCE TO RELATED APPLICATION

This application is based upon and claims the benefit of priority from Japanese Patent Application No. 2017-208566, filed on Oct. 27, 2017, the entire contents of which are incorporated herein by reference.

TECHNICAL FIELD

The present disclosure relates to a technique for peeling off a thin film formed inside a film forming apparatus after a film is formed by supplying a gas to a substrate.

BACKGROUND

In a manufacturing process of a semiconductor device, various films such as a $Si_3N_4$ (hereinafter referred to as silicon nitride or SiN) film and the like are formed on a semiconductor wafer (hereinafter referred to as a wafer) which is a substrate. This film forming process is performed by a method called ALD (Atomic Layer Deposition) in which a raw material gas and a reaction gas are alternately supplied to the wafer a plurality of times. As the film forming apparatus that performs ALD, there is known an apparatus configured so that a wafer is mounted on a rotary table provided inside a vacuum container and the wafer revolved by rotation of the rotary table repeatedly passes through a processing region formed of an atmosphere to which a raw material gas is supplied and a processing region formed of an atmosphere to which a reaction gas is supplied. In addition to the atmosphere of the raw material gas and the atmosphere of the reaction gas, a modifying gas for modifying a film is supplied onto the rotary table, whereby predetermined regions to which the reaction gas and the modifying gas are respectively supplied are formed. Furthermore, an isolation region for supplying a separation gas so as to separate these processing regions is formed.

In the above-described film forming apparatus, the raw material gas and the reaction gas are also supplied to the rotary table in addition to the wafer. Therefore, a film is also formed on the rotary table. For example, when the film forming temperature varies depending on the type of the wafer, the rotary table is used in a plurality of temperature zones. If the temperature of the rotary table is changed in the state in which the film is formed on the rotary table in this manner, for example, the surface layer portion of the film formed on the rotary table may be peeled off due to thermal shrinkage caused by the temperature change and may become particles. Therefore, in the related art, when film formation is not performed, the rotary table is replaced to remove the film adhering to the rotary table, or a cleaning gas is supplied into the vacuum container to perform a cleaning process of removing the film of the rotary table. However, it takes a long time to replace the rotary table. Thus, there is a problem that the throughput of the apparatus is lowered. In the case where the film adhering to the rotary table is removed by supplying the cleaning gas, the peeled-off film may remain as particles inside the film forming apparatus. Thereafter, when a film forming process is performed on the wafer, particles may adhere to the wafer.

In the related art, there is known a technique in which a purge gas is supplied to a portion on a rotary table in a separation region having a high temperature and the heated portion is cooled by allowing the heated portion to pass through a processing region, whereby a silicon oxide film formed on the rotary table is thermally shrunk and is made less likely to peel off. However, it takes time to change the temperature of the rotary table by blowing a high-temperature purge gas.

Furthermore, in the related art, there is known a technique in which, in a heat treatment apparatus for heating substrates arranged in a shelf inside a reaction container from a circumferential direction of the substrates and supplying a gas to the substrates, a purge gas is supplied into the reaction container to increase the pressure when heating and then cooling the interior of the reaction container. Then, by repeating the heating of the interior of the reaction container, and the cooling and pressure increasing a plurality of times, the film adhering to the interior of the reaction container is removed. However, there are demands for improvement of the throughput of the apparatus and for more reliable suppression of the particles. Thus, a demand has existed for further improvement.

SUMMARY

Some embodiments of the present disclosure provide a technique capable of quickly removing a portion of a thin film formed inside a processing container and likely to be peeled off during a film forming process for a substrate, in a film forming apparatus for forming a film by supplying a gas to a substrate mounted inside a processing container.

According to one embodiment of the present disclosure, there is provided a film forming apparatus for performing a film forming process by supplying a film forming gas to a substrate in a vacuum atmosphere, including: a processing container in which a mounting part for mounting a substrate thereon is provided; a heating part configured to heat the substrate mounted on the mounting part; an exhaust part configured to evacuate an inside of the processing container; a cooling gas supply part configured to supply a cooling gas into the processing container; a purge gas supply part configured to supply a purge gas into the processing container; and a control part configured to output a control signal for executing a step of applying a stress to a thin film formed inside the processing container by unloading the substrate subjected to the film forming process from the processing container and then cooling the inside of the processing container from a first temperature to a second temperature by the cooling gas, a step of supplying a purge gas into the processing container to peel off the thin film at least after the inside of the processing container is cooled from the first temperature to the second temperature, and a step of exhausting the purge gas, wherein the cooling gas has a larger heat transfer coefficient than the purge gas.

According to another embodiment of the present disclosure, there is provided an operation method of a film forming apparatus for performing a film forming process by supplying a film forming gas to a substrate in a vacuum atmosphere, including: applying a stress to a thin film formed inside a processing container by unloading the substrate subjected to the film forming process from the processing container and then cooling the inside of the processing container from a first temperature to a second temperature by a cooling gas; supplying a purge gas into the processing container to peel off the thin film at least after the inside of the processing container is cooled from the first temperature to the second temperature; and exhausting the purge gas, wherein the cooling gas has a larger heat transfer coefficient than the purge gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an explanatory view showing another example of a sequence in an operation method of a film forming apparatus.

FIG. 10 is an explanatory view showing a further example of a sequence in an operation method of a film forming apparatus.

FIG. 11 is a characteristic diagram showing the number of particles adhering to a wafer before and after an operation method of a film forming apparatus in an example.

DETAILED DESCRIPTION

Figure 1:
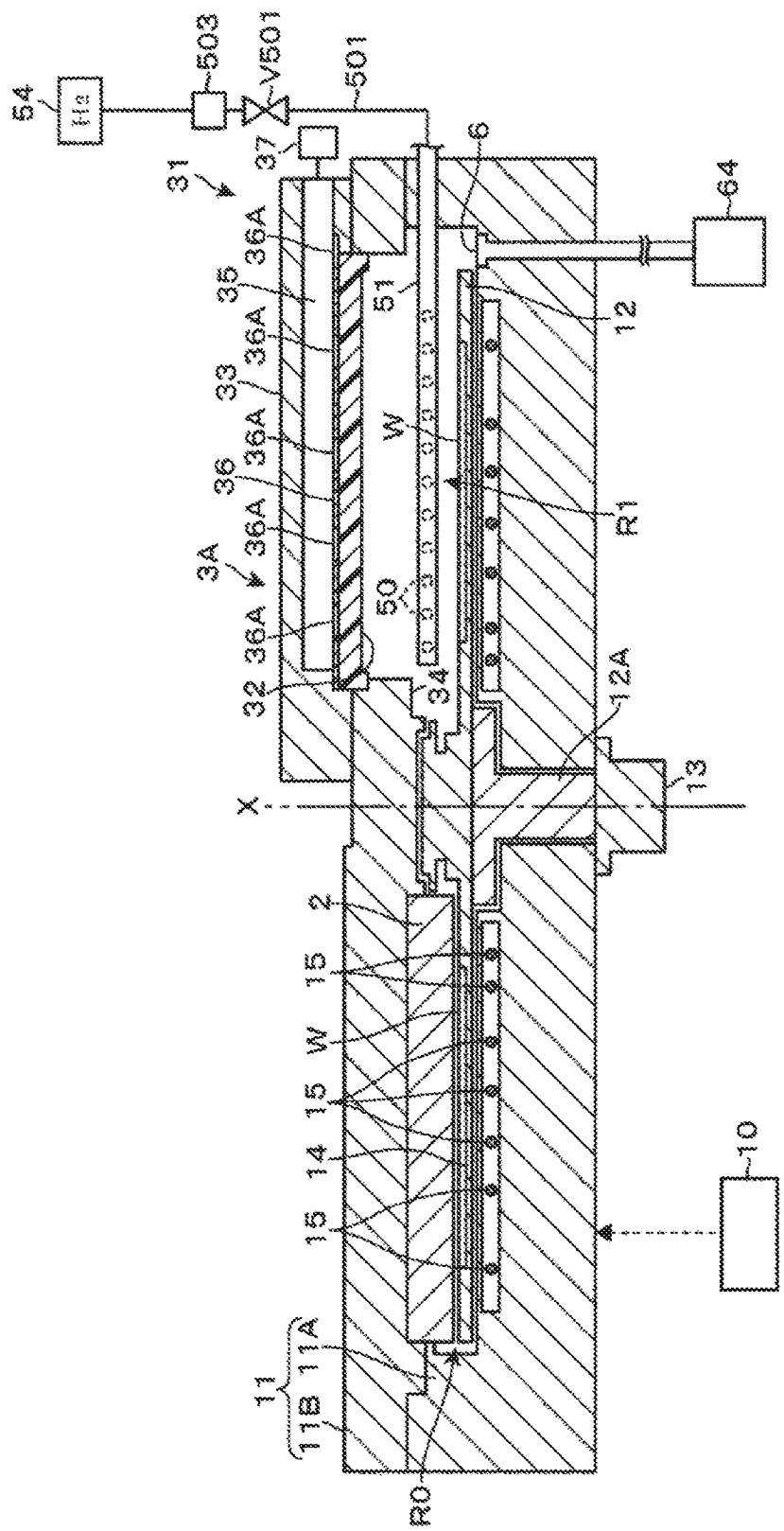
FIG. 1 is a vertical sectional side view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus according to an embodiment of the present disclosure will be described with reference to a vertical sectional side view of FIG. 1 and a horizontal sectional plan view of FIG. 2. In this film forming apparatus, a film forming process for forming a SiN film on a surface of a wafer W is performed by the above-described ALD method, and a modifying process for modifying the SiN film is performed in parallel to the film forming process. In addition, every predetermined period, for example, when the cumulative film thickness of the SiN film formed on the wafer W reaches a predetermined value, a process of peeling off a surface layer portion of a SiN film formed on a portion inside a vacuum container as a processing container, for example, on a surface of a rotary table, is performed.

In the figures, reference numeral 11 denotes a flat substantially-circular vacuum container (processing container), which is composed of a container main body 11A constituting a side wall and a bottom portion, and an upper member 11B. In the figures, reference numeral 12 denotes a circular rotary table which is a mounting part on which a wafer W is mounted. In the figure, reference numeral 12A denotes a support part for supporting the central portion of the back surface of the rotary table 12. The rotary table 12 is rotated in a circumferential direction and clockwise in a plan-view by a rotation mechanism 13. X in FIG. 1 indicates the rotation axis (rotation center) of the rotary table 12.

On the upper surface of the rotary table 12, six circular recesses 14, each of which accommodates a wafer W, are provided along the circumferential direction (rotational direction) of the rotary table 12. In addition, a plurality of heaters 15, which are temperature adjustment parts for adjusting the temperature of the rotary table 12 and heating the wafer W mounted on the rotary table 12, are provided concentrically on the bottom of the vacuum container 11. The heaters 15 are configured to be turned on and off by a control part 10 which will be described later. By turning on the heaters 15, the temperature of the rotary table 12 is increased to a set temperature, for example, 450 degrees C. By turning off the heaters 15, the temperature of the rotary table 12 can be reduced from 450 degrees C. Further, the set temperature is configured so as to be adjustable by an output signal outputted by the control part 10 described later. Therefore, the heaters 15 correspond to a temperature adjustment part for adjusting the temperature of the rotary table 12.

Figure 2:
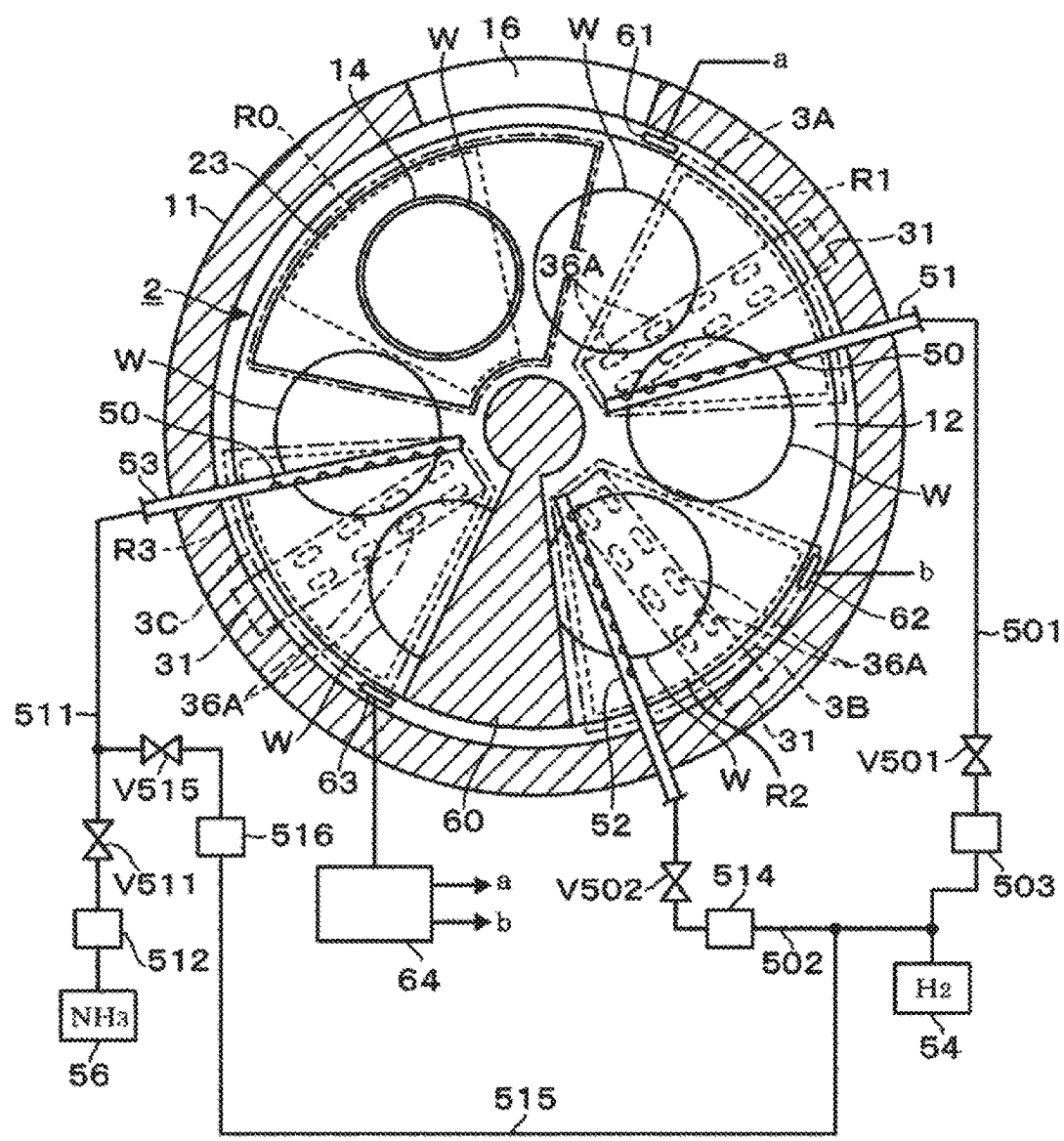
FIG. 2 is a horizontal sectional plan view of the film forming apparatus.

As shown in FIG. 2, a transfer port 16 for loading and unloading the wafer W is opened on the side wall of the vacuum container 11. The transfer port 16 is configured to be freely opened and closed by a gate valve (not shown). Three lift pins (not shown) for pushing up the wafer W mounted on the rotary table 12 from the lower side are arranged at equal intervals in the circumferential direction of the wafer W on the lower side of the rotary table 12 in the region facing the transfer port 16 of the vacuum container 11. Holes are formed in the bottom of each recess 14 so as to correspond to the three lift pins. When loading and unloading the wafer W, the rotary table 12 is sequentially stopped at a position where the holes of the recess 14 and the lift pins overlap with each other in the vertical direction. By virtue of the cooperative action of a substrate transfer mechanism (not shown) outside the film forming apparatus and the lift pins, the wafer W is delivered between the outside of the vacuum container 11 and the inside of the recess 14 via the transfer port 16.

As shown in FIG. 2, on the rotary table 12, a gas supply/exhaust unit 2 and three plasma forming units 3A, 3B and 3C are provided toward the downstream side in the rotation direction of the rotary table 12 (clockwise in this example) in the named order along the rotation direction.

The gas supply/exhaust unit 2 will be described with reference to FIG. 3 which is a vertical sectional side view and FIG. 4 which is a bottom view. The gas supply/exhaust unit 2 is formed in a fan shape widening in the circumferential direction of the rotary table 12 from the center side of the rotary table 12 toward the peripheral side thereof in a plan view. The lower surface of the gas supply/exhaust unit 2 is adjacent to and opposed to the upper surface of the rotary table 12.

The gas supply/exhaust unit 2 is made of, for example, aluminum. Gas discharge ports 21, an exhaust port 22 and a purge gas discharge port 23, which constitute a discharge part, are opened on the lower surface of the gas supply/exhaust unit 2. In order to facilitate identification in the figure, in FIG. 4, the exhaust port 22 and the purge gas discharge port 23 are indicated by a large number of dots. Further, in FIG. 2, the purge gas discharge port 23 is indicated by a line in order to avoid complicated illustration. A large number of gas discharge ports 21 are arranged in a fan-shaped region 24 on the inner side of the peripheral portion of the lower surface of the gas supply/exhaust unit 2. The gas discharge ports 21 discharge a DCS gas downward in a shower shape and supplies the DCS gas to the entire surface of the wafer W during the rotation of the rotary table 12 at the time of film formation.

In the fan-shaped region 24, three sections 24A, 24B and 24C are set from the center side of the rotary table 12 toward the peripheral side of the rotary table 12. Gas flow paths 25A, 25B and 25 C partitioned from each other are provided in the gas supply/exhaust unit 2 so that the gas flow paths 25A, 25B and 25 C can independently supply the DCS gas to the gas discharge ports 21 provided in the respective sections 24A, 24B and 24C. The respective upstream sides of the gas flow paths 25A, 25B and 25C are connected to a DCS gas supply source 26 via pipes. A flow rate adjustment part 27 constituted by a mass flow controller and a valve V27 are provided in each pipe.

Subsequently, the exhaust port 22 and the purge gas discharge port 23 will be described. The exhaust port 22 and the purge gas discharge port 23 are annularly opened at the peripheral portion of the lower surface of the gas supply/exhaust unit 2 so as to surround the fan-shaped region 24 (see FIG. 4) and so as to face the upper surface of the rotary table 12. The purge gas discharge port 23 is located outside the exhaust port 22. A region inside the exhaust port 22 on the rotary table 12 constitutes an adsorption region R0 which is a raw material gas supply region where DCS is adsorbed onto the surface of the wafer W. The purge gas discharge port 23 discharges, for example, an Ar (argon) gas as a purge gas on the rotary table 12.

Figure 3:
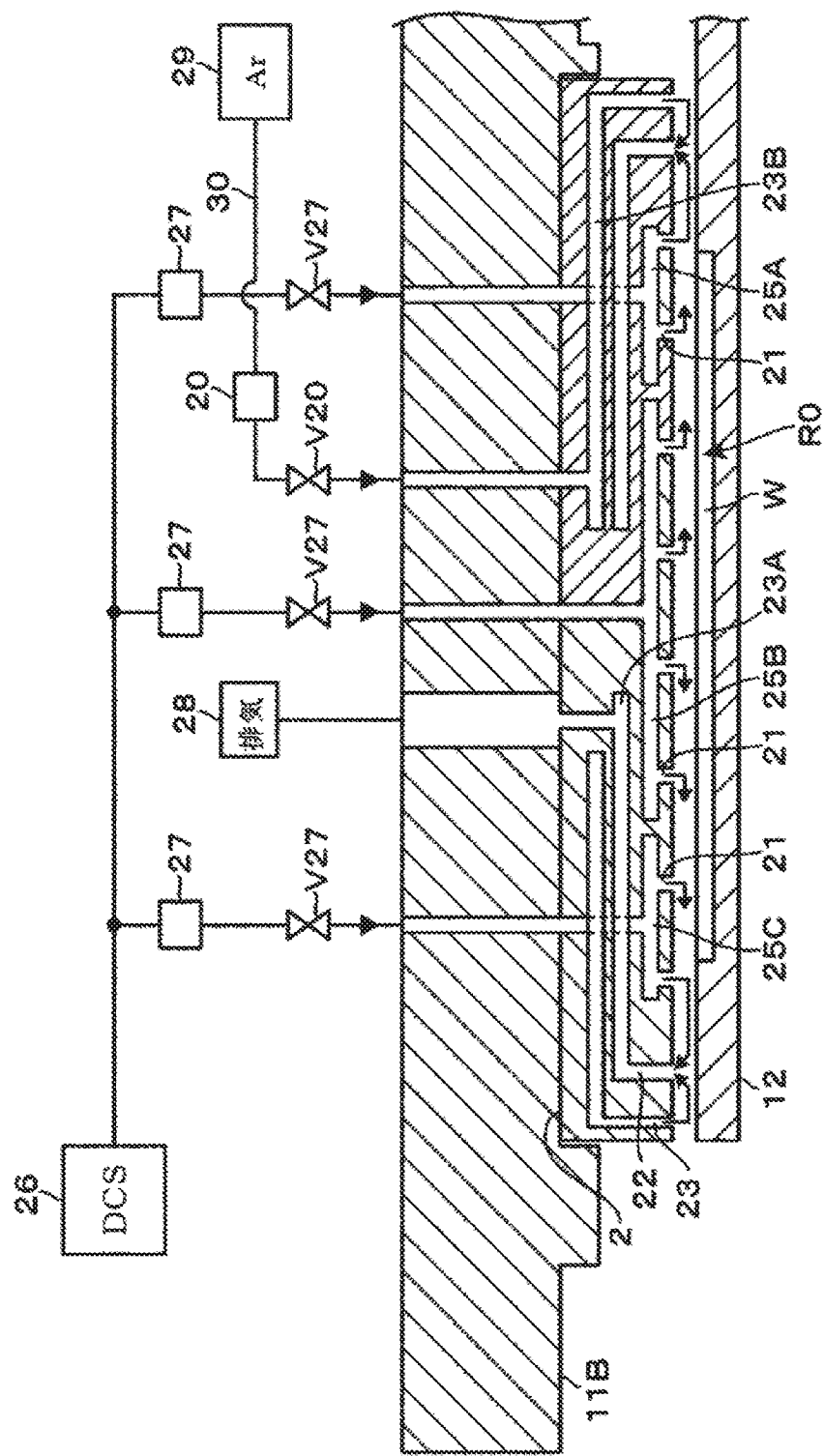
FIG. 3 is a vertical sectional side view of a gas shower head provided in the film forming apparatus.
Figure 4:
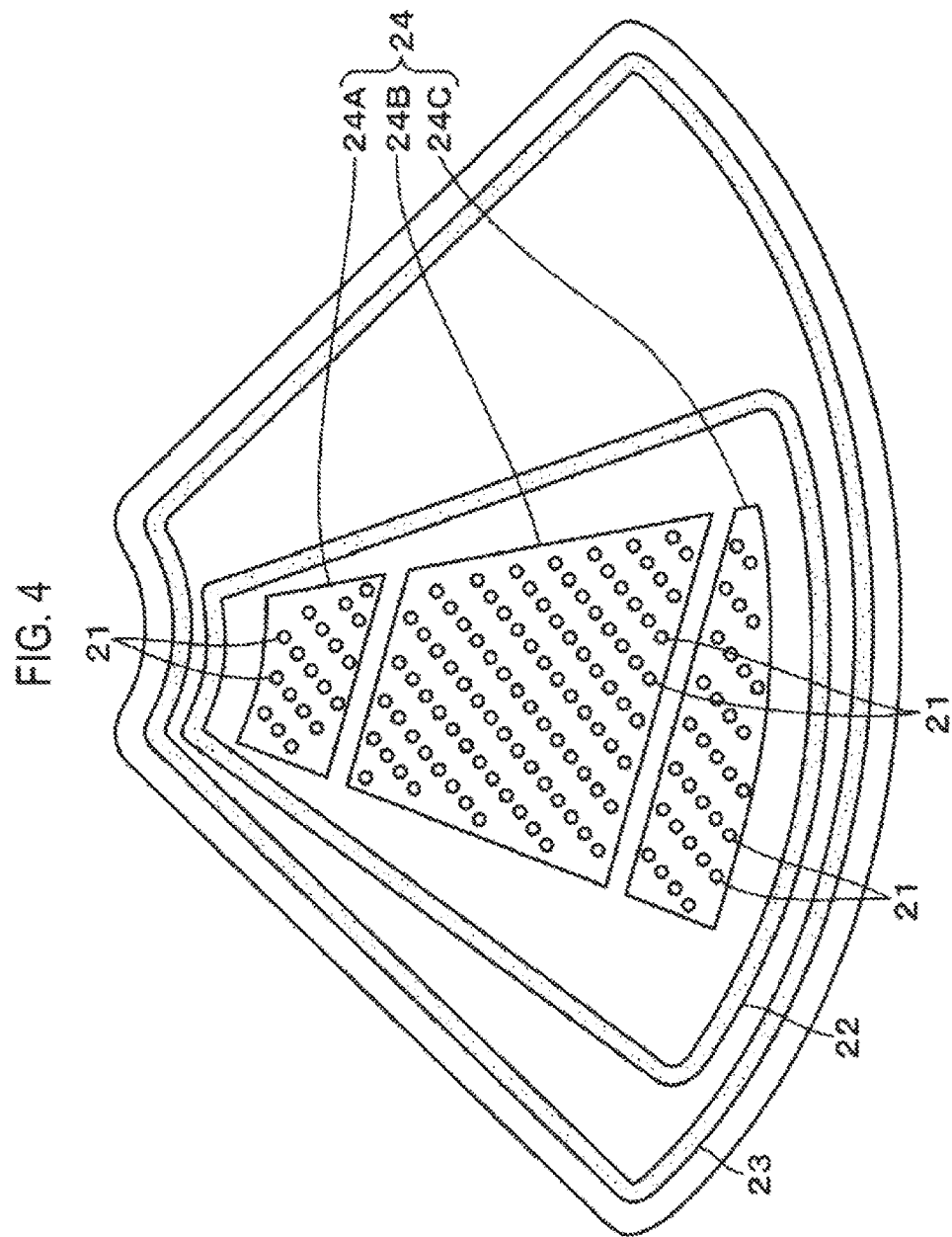
FIG. 4 is a bottom view of the gas shower head.
Figure 5:
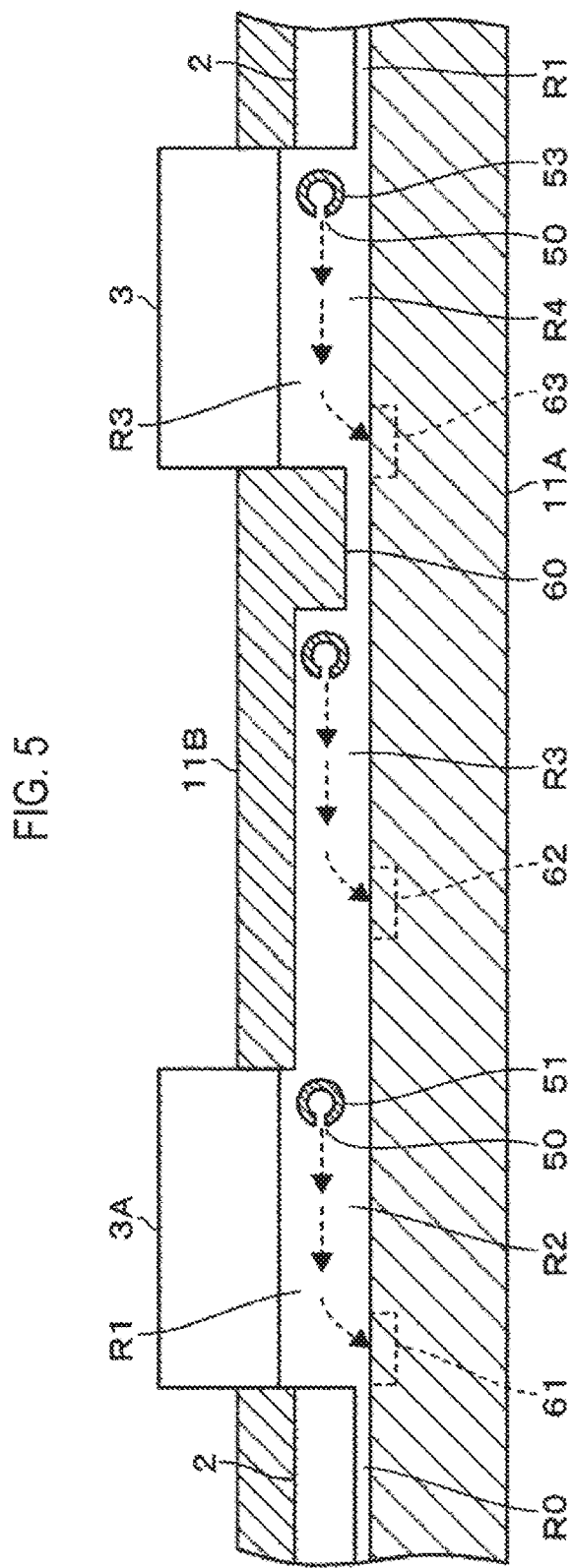
FIG. 5 is a schematic vertical sectional side view taken along the circumferential direction of the film forming apparatus.

Reference numerals 23A and 23B in FIG. 3 denote gas flow paths respectively provided in the gas supply/exhaust unit 2 and partitioned from each other. The gas flow paths 23A and 23B are also partitioned from the raw material gas flow paths 25A to 25C. The upstream end of the gas flow path 23A is connected to the exhaust port 22, and the downstream end of the gas flow path 23A is connected to an exhaust device 28. The exhaust device 28 can exhaust a gas from the exhaust port 22. The downstream end of the gas flow path 23B is connected to the purge gas discharge port 23, and the upstream end of the gas flow path 23B is connected to the Ar gas supply source 29. A flow rate adjustment part 20 and a valve V20 are installed in a pipe 30 that connects the gas flow path 23B and the Ar gas supply source 29.

During the film forming process, the discharge of the raw material gas from the gas discharge port 21, the exhaust from the exhaust port 22 and the discharge of the purge gas from the purge gas discharge port 23 are performed together. Thus, as indicated by arrows in FIG. 3, the raw material gas and the purge gas discharged toward the rotary table 12 are directed to the exhaust port 22 through the upper surface of the rotary table 12 and are exhausted from the exhaust port 22. By performing the discharge and exhaust of the purge gas in this way, the atmosphere in the adsorption region R0 is separated from the external atmosphere, and the raw material gas can be limitedly supplied only to the adsorption region R0. The purge gas discharged from the purge gas discharge port 23 is also used as a purge gas to be supplied at the time of removing the film formed on the SiN film formed on the rotary table 12. Accordingly, the purge gas discharge port 23, the gas flow path 23B, the Ar gas supply source 29, the pipe 30, the flow rate adjustment part 20 and the valve V20 correspond to a purge gas supply part.

Next, plasma forming units 3A to 3C will be described. Since the plasma forming units 3A to 3C are configured in substantially the same manner, only the plasma forming unit 3A will be described here. As shown in FIGS. 1 to 3, the plasma forming unit 3A supplies a gas for plasma formation onto the rotary table 12 and supplies microwaves to the gas to generate plasma on the rotary table 12. The plasma forming unit 3A includes an antenna 31 for supplying the microwaves. The antenna 31 includes a dielectric plate 32 and a metal-made waveguide 33.

The dielectric plate 32 is formed in a substantially fan-like shape so as to widen from the center side to the peripheral side of the rotary table 12 in a plan view. A generally fan-shaped through hole is provided in the upper member 11B of the vacuum container 11 so as to correspond to the shape of the dielectric plate 32. The inner circumferential surface of the lower end portion of the through hole slightly protrudes toward the central portion of the through hole so as to form a support portion 34. The dielectric plate 32 is provided so as to close the through hole from the upper side and so as to face the rotary table 12. The peripheral edge portion of the dielectric plate 32 is supported by the support portion 34.

The waveguide 33 is provided on the dielectric plate 32 and has an internal space 35 extending on the upper member 11B. Reference numeral 36 in the figure denotes a slot plate constituting the lower side of the waveguide 33. The slot plate 36 is provided so as to make contact with the dielectric plate 32 and has a plurality of slot holes 36A. An end portion of the waveguide 33 on the center side of the rotary table 12 is closed, and a microwave generator 37 is connected to an end portion of the waveguide 33 on the peripheral edge side of the rotary table 12. The microwave generator 37 supplies microwaves of, for example, about 2.45 GHz, to the waveguide 33. This microwave passes through the slot holes 36A of the slot plate 36 and reaches the dielectric plate 32. The microwaves are supplied to the gas which was discharged to below the dielectric plate 32 from a gas injector and a nozzle which will be described later, whereby plasma can be formed below the dielectric plate 32. In this manner, the generally fan-shaped region below the dielectric plate 32 constitutes a plasma generation region which is denoted as R1.

The plasma forming units 3B and 3C are configured in the same manner as the above-described plasma forming unit 3A. The processing regions of the plasma forming units 3B and 3C are denoted as second and third processing region R2 and R3, respectively. Accordingly, the first, second and third processing regions R1, R2 and R3 are respectively provided at different positions in the rotation direction of the rotary table 12. Plasma is individually formed in the first, second and third processing regions R1 to R3 by the microwaves supplied from the plasma forming units 3A to 3C.

As shown in FIG. 2, elongated tubular gas injectors 51 to 53 are provided at end portions of the first processing region R1 to the third processing region R3, at the downstream side in the rotation direction of the rotary table 12, respectively. The gas injectors 51 to 53 extend horizontally from the sidewall of the vacuum container 11 toward the central region and are provided so as to intersect the passing region of the wafer W mounted on the rotary table 12. In the gas injectors 51 to 53, a large number of gas discharge holes 50 are arranged along the length direction thereof and are opened in the horizontal direction. When viewed in the rotation direction of the rotary table 12, the gas injector 51 discharges a gas to the first processing region R1 so as to flow toward the upstream side of the first processing region R1, and the gas injector 52 discharges a gas to the second processing region R2 so as to flow toward the upstream side of the second processing region R2. Further, the gas injector 53 discharges a gas to the third processing region R3 so as to flow toward the upstream side of the third processing region R3.

Reference numeral 501 in FIG. 2 denotes a pipe connected to the gas injector 51. The upstream side of the pipe 501 is connected to a $H_2$ (hydrogen) gas supply source 54 via a valve V501 and a flow rate adjustment part 503. Reference numeral 502 in FIG. 2 denotes a pipe connected to the gas injector 52. The upstream side of the pipe 502 is connected to the $H_2$ (hydrogen) gas supply source 54 via a valve V502 and a flow rate adjustment part 514. Accordingly, a $H_2$ gas is discharged from the gas injectors 51 and 52. The $H_2$ gas is a gas for modifying a SiN film and is a gas for rapidly cooling the rotary table 12 in the process of peeling off the SiN film formed on the rotary table 12 as described below. The pipes 501 and 502, the gas injectors 51 and 52, the valves V501 and V502, the flow rate adjustment parts 503 and 514 and the gas supply source 54 correspond to a cooling gas supply part.

Reference numeral 511 in FIG. 2 denotes a pipe connected to the gas injector 53. The upstream side of the pipe 511 is connected to a $NH_3$ gas supply source 56 via a valve V511 and a flow rate adjustment part 512. The downstream end of a pipe 515 is connected to the pipe 511 on the downstream side of the valve V511. The upstream end of the pipe 515 is connected to the $H_2$ gas supply source 54 via the valve V515 and the flow rate adjustment part 516.

Figure 6:
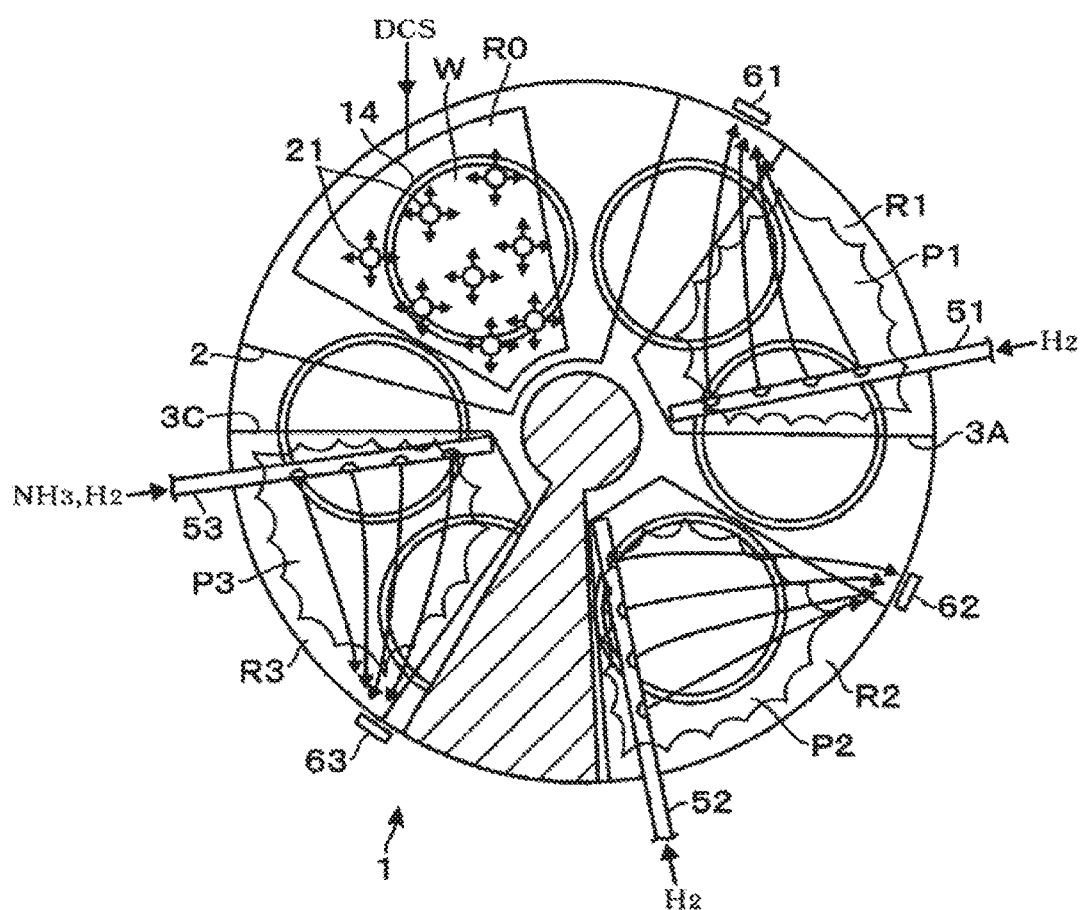
FIG. 6 is a plan view showing the film forming apparatus during a film forming process.

Further, a separation region 60 is provided in a region of the gas injector 52 at the downstream side in the rotation direction of the rotary table 12, which is on the upstream side of the third processing region R3. As shown in FIG. 6, the ceiling surface of this separation region 60 is set to be lower than the ceiling surface of each of the second processing region R2 and the third processing region R3. The separation region 60 is provided to prevent the $NH_3$ gas supplied to the downstream side of the separation region 60 in the rotation direction of the rotary table 12 from being mixed and diluted with the gas supplied to the upstream side of the separation region 60 in the rotation direction of the rotary table 12.

As shown in FIG. 2, a first exhaust port 61, a second exhaust port 62 and a third exhaust port 63 are respectively opened at positions which are outside the rotary table 12 and which face the upstream end of the first processing region R1 in the rotation direction of the rotary table 12, the upstream end of the second processing region R2 and the upstream end of the third processing region R3, respectively. Reference numeral 64 in the figure denotes an exhaust device, which is constituted by a vacuum pump or the like and is connected to the first exhaust port 61, the second exhaust port 62 and the third exhaust port 63 via exhaust pipes.

As shown in FIG. 1, the film forming apparatus is provided with a control part 10 including a computer. A program is stored in the control part 10. In this program, a group of steps is organized so that control signals are transmitted to the respective parts of the film forming apparatus to control the operations of the respective parts and so that the processing of an operation method of a film forming apparatus described later is executed. More specifically, the number of revolutions of the rotary table 12 rotated by the rotation mechanism 13, the flow rate and supply/cutoff of each gas supplied through the flow rate adjustment part and the valve, the exhaust amount of each gas exhausted by each of the exhaust devices 28 and 64, the supply/cutoff of microwaves supplied from the microwave generator 37 to the antenna 31, the on/off of the power supply to the heaters 15 and the like are controlled by the program. In addition, for example, the program is configured to adjust the current supplied to the heaters 15 and is configured to adjust the heating temperature of the heaters 15. The program is stored in a storage medium such as a hard disk, a compact disk, a DVD, a memory card or the like and is installed in the control part 10.

Hereinafter, the operation method of the film forming apparatus according to the present disclosure will be described. First, the film forming process of the wafer W in the film forming apparatus will be described with reference to FIG. 6. FIG. 6 is an explanatory view showing the flows of the respective gases supplied into the vacuum container 11 by arrows. First, six wafers W are delivered to the respective recesses 14 of the rotary table 12 by the cooperative action of the lift pins and the substrate transfer mechanism as described above. Next, the gate valve provided at the transfer port 16 of the vacuum container 11 is closed to hermetically seal the interior of the vacuum container 11. The wafers W mounted on the recesses 14 are heated to, for example, 500 degrees C. or more, more specifically 550 degrees C., by the heaters 15. Then, by virtue of the exhaust from the first to third exhaust ports 61, 62 and 63, the inside of the vacuum container 11 is brought into a vacuum atmosphere of, for example, 2 Torr (266.6 Pa). The rotary table 12 is rotated clockwise by a predetermined revolution number.

Then, the $H_2$ gas is supplied from the gas injectors 51 and 52 to the first and second processing regions R1 and R2, respectively. The $NH_3$ gas and the $H_2$ gas are supplied from the gas injector 53 to the third processing region R3. While the respective gases are supplied in this way, microwaves are supplied to the first to third processing regions R1 to R3 from the microwave generators 37 of the plasma forming units 3A to 3C, respectively. Plasma P1 and plasma P2 of the $H_2$ gas are formed in the first and second processing regions R1 and R2 by the microwaves. Plasma P3 of the $H_2$ gas and the $NH_3$ gas is formed in the third processing region R3. In the gas supply/exhaust unit 2, the DCS gas is discharged from the gas discharge ports 21, the Ar gas is discharged from the purge gas discharge port 23, and the gases are exhausted from the exhaust port 22. FIG. 6 shows the state in which the gases are supplied to the respective parts and the plasmas P1 to P3 are formed in this way.

When the wafer W is positioned in the adsorption region R0 by further rotating the rotary table 12, the DCS gas is supplied to and adsorbed onto the surface of the wafer W. At the initial stage of rotation of the wafer W, since the portion where DCS is adsorbed have not reacted with $NH_3$, it passes through the first and second processing regions R1 and R2 as it is. Further, when the rotary table 12 is further rotated so that the wafer W reaches the third processing region R3, DCS adsorbed onto the wafer W reacts with $NH_3$ to generate SiN which is a reaction product, and Cl (chlorine) remaining on the wafer W is removed by the active species of hydrogen generated by converting the $H_2$ gas supplied to the third processing region R3 into plasma.

By further rotating the rotary table 12, the wafer W having passed through the third processing region R3 enters the adsorption region R0, and the DCS is adsorbed again. Then, the wafer W enters the first processing region R1, and Cl is removed from the molecular group formed on the wafer W.

In this way, the rotation of the rotary table 12 is continued, and the wafer W sequentially and repeatedly passes through the adsorption region R0, the first processing region R1, the second processing region R2 and the third processing region R3 a plurality of times, whereby SiN is deposited on the surface of the wafer W to increase the film thickness of the SiN film and the modification of the SiN film proceeds.

Then, when the SiN film is formed at a desired film thickness on the wafer W, the discharge and exhaust of the respective gases in the gas supply/exhaust unit 2 are stopped. In addition, the discharge of the respective gases from the gas injectors 51 and 53 is stopped, the supply of the microwaves to the first to third processing regions R1 to R3 is stopped, and the formation of the plasma P1 to P3 is stopped. Further, the gate valve is opened, and the wafer W is unloaded to the outside of the vacuum container 11 by a substrate transfer mechanism (not shown).

When performing the film forming process on the wafer W, the DCS gas is also adsorbed onto the surface (upper surface) of the rotary table 12 in the adsorption region R0. As the rotary table 12 further passes through the plasma P1 and P3, whereby a SiN film is formed and gradually accumulated on the rotary table 12 as on the surface of the wafer W. When the wafer W is processed by the above-described film forming apparatus, for example, the set temperature in the film forming process varies depending on the type of the wafer W. For example, the wafer W in a certain lot is processed at a process temperature of 450 degrees C., and the wafer W in another lot is processed at a process temperature of 400 degrees C. While the film forming process is performed in this manner, the SiN film formed on the surface of the rotary table 12 is exposed to a temperature difference of, for example, about 200 degrees C. Cracks sometimes occur on the surface of the SiN film formed on the surface of the rotary table 12 due to thermal shrinkage. Such a cracked portion tends to peel off easily and may be peeled off to form particles.

In the film forming apparatus according to the above-described embodiment, the surface of the film cumulatively formed on the rotary table 12 is rapidly peeled off and removed in advance by a purge gas. The setting of the timing of executing a process of peeling off the surface of the film will be described. For example, in the film forming apparatus, for each recipe used for film formation, the film thickness formed according to a recipe is stored in a memory (not shown) of the control part 10. When each recipe is executed by the film forming apparatus, the film thickness to be formed according to the executed recipe is added. Further, a target value of the film thickness of the film formed on the rotary table 12 is stored in the memory of the control part 10. Further, for example, after the film forming apparatus is cleaned, the addition of the film thickness is started. As the film thickness of each recipe executed by driving the film forming apparatus is added, the added value of the accumulated film thickness reaches the target value. When it becomes time to perform the film peeling process in this manner, the film forming apparatus issues, for example, an alarm. Further, when the processing of all the wafers W of the lot is completed, the loading of the wafers W of a subsequent lot is stopped. Then, all the wafers W in the film forming apparatus are unloaded. A process of peeling off the surface portion of the SiN film formed on the upper surface of the rotary table 12 is performed in a state in which no wafer W is loaded in the vacuum container 11.

Figure 7:
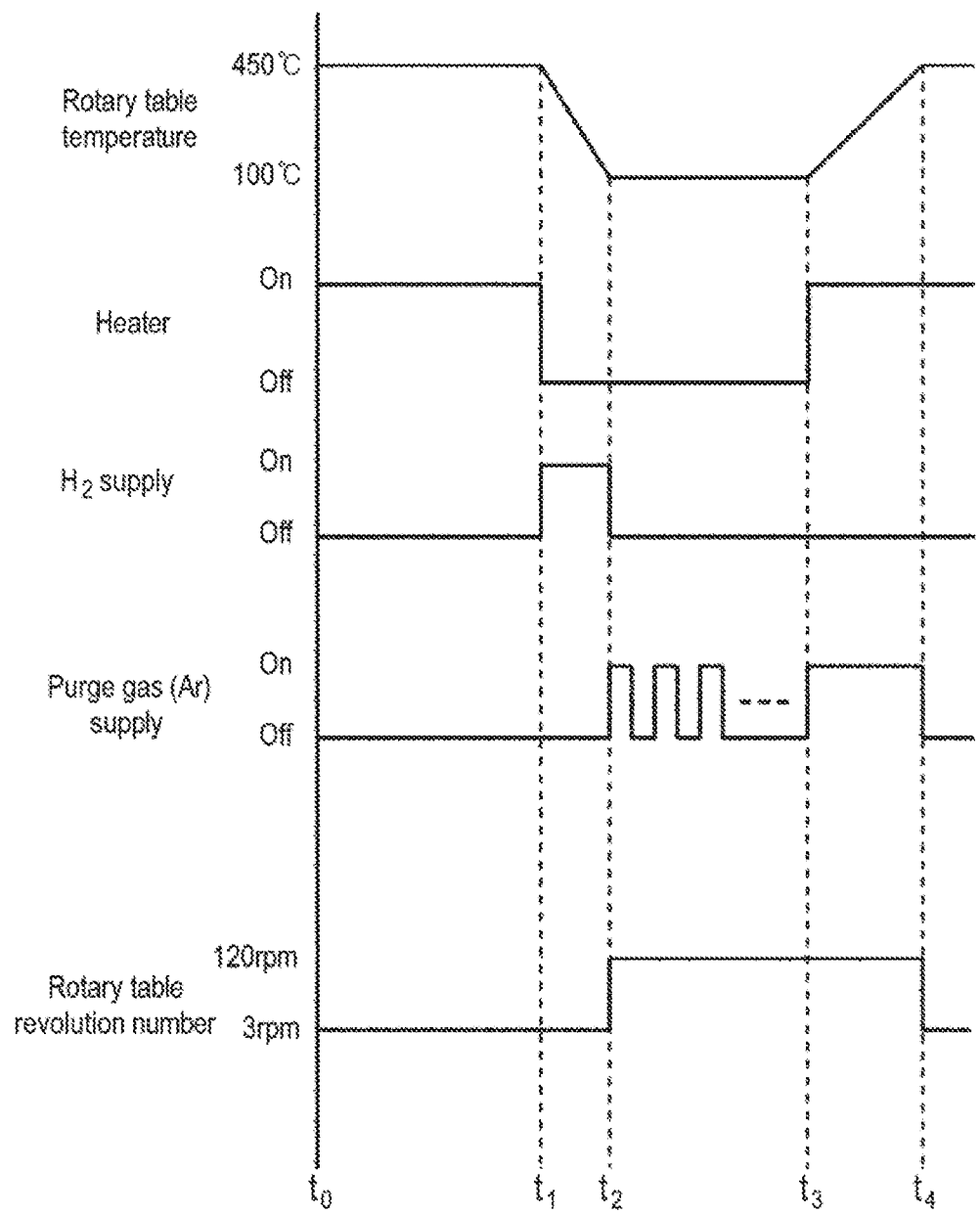
FIG. 7 is an explanatory view showing a sequence in an operation method of a film forming apparatus.

The process of peeling off the film will be described with reference to the sequence shown in FIG. 7. First, the temperature of the rotary table 12 is maintained at, for example, 450 degrees C. which is the process temperature of the wafer W with which the alarm has been issued. The gate valve is closed and the exhaust is performed from the first to third exhaust ports 61 to 63, whereby the pressure inside the vacuum container 11 is set to 2 Torr (266.6 Pa). In this embodiment, the process temperature 450 degrees C. of the film forming process for the wafer W is set as a first temperature. Therefore, it can be said that the temperature in the processing container reaches the first temperature by the operation of heating the rotary table 12 to 450 degrees C. in order to perform the process of the wafer W with which the alarm has been issued.

Figure 8:
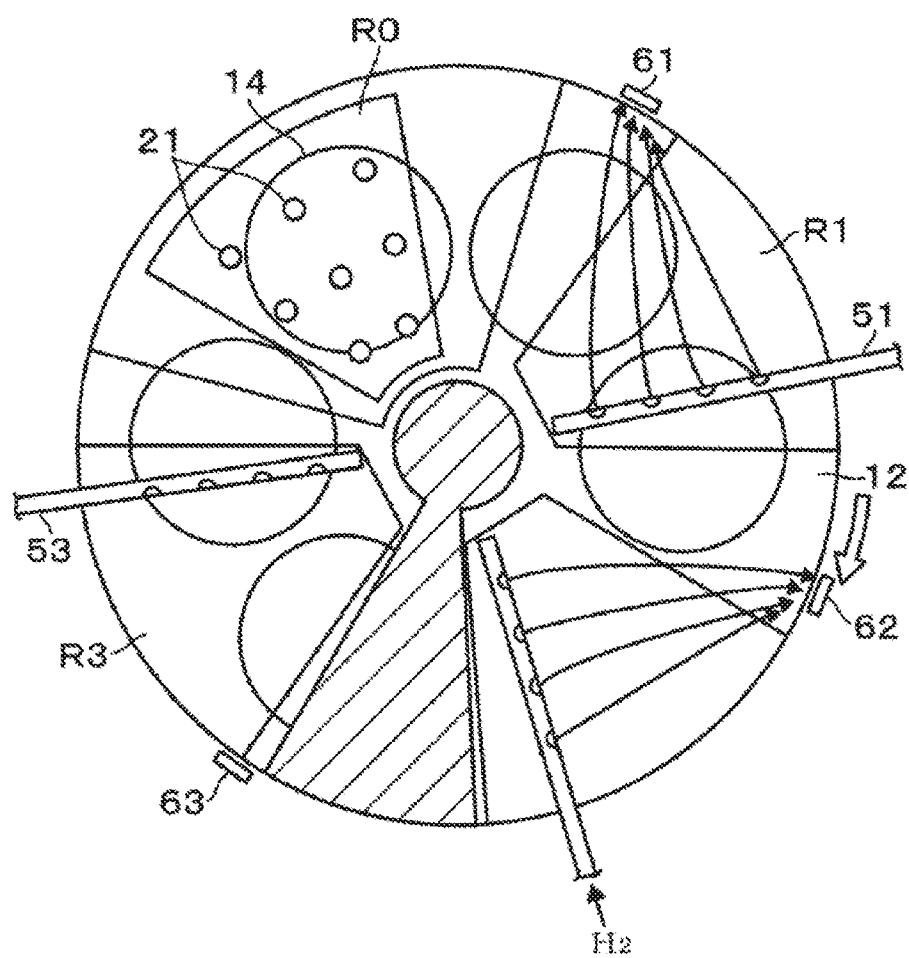
FIG. 8 is an explanatory view showing an operation method of a film forming apparatus.

Further, the rotary table 12 is rotated at a revolution number of 3 rpm. Next, at the time t1, the heaters 15 of the rotary table 12 are turned off. Moreover, the valves V501 and V502 are opened, and the $H_2$ gas kept at a room temperature (25 degrees C.) is supplied from the gas injectors 51 and 52 for 20 minutes at a total flow rate of 4 slm. Thus, as shown in FIG. 8, the $H_2$ gas is supplied to the first processing region R1 and the second processing region R2 of the rotary table 12. At this time, the pressure inside the vacuum container 11 is as low as 266.6 Pa. Thus, the gas horizontally discharged from the gas injector 51 diffuses promptly. As a result, the portion of the rotary table 12 within the first processing region R1 and the portion of the rotary table 12 within the second processing region R2 are exposed to the $H_2$ gas. The $H_2$ gas has a larger heat transfer coefficient and a larger kinetic energy than the gas used as a purge gas, i.e., an Ar gas in this example. Therefore, the rotary table 12 toward which the $H_2$ gas is blown is deprived of much heat and is rapidly cooled as compared with a case where an Ar gas is blown toward the rotary table 12. As the rotary table 12 rotates, the entire upper surface of the rotary table 12 is exposed to the $H_2$ gas and is cooled. As a result, the rotary table 12 is cooled from 450 degrees C. to 100 degrees C., which is a second temperature, in a short time of about 20 minutes.

At this time, the temperature of the rotary table 12 suddenly drops, and the SiN film cumulatively formed on the surface of the rotary table 12 shrinks sharply due to the temperature difference. As described above, the temperature difference between the lots of the wafer W during the process is about 200 degrees C. Therefore, by turning off the heaters 15 of the rotary table 12 and supplying the $H_2$ gas, a temperature difference larger than the temperature difference during the process is applied in a short time to the SiN film cumulatively formed on the surface of the rotary table 12. Accordingly, the SiN film cumulatively formed on the surface of the rotary table 12 is abruptly thermally shrunk by a larger force. Due to this abrupt shrinkage, a pulling force (stress) acts on the SiN film in the horizontal direction. Therefore, a large force tending to shift the SiN film from the surface of the rotary table 12 is applied. As a result, the SiN film is peeled off from the surface of the rotary table 12, or the force fixing the SiN film to the surface of the rotary table 12 is weakened so that the SiN film becomes easy to peel off.

Next, at the time t2, the valves V501 and V502 are closed to stop the supply of the $H_2$ gas, and the number of revolutions of the rotary table 12 is increased to 120 rpm. For 60 minutes from the time t2 to the time t3, the valve V27 in the gas supply/exhaust unit 2 is closed and the exhaust of the exhaust device 28 is stopped, in which state the on/off of the valve V20 is alternately switched at 150-second intervals. As a result, the intermittent supply of the purge gas in which the Ar gas as a purge gas is supplied from the purge gas discharge port 23 of the purge gas supply part of the gas supply/exhaust unit 2 for 150 seconds at a flow rate of 16 slm and the supply of the Ar gas is stopped for 150 seconds is repeated twelve times.

At this time, the SiN film peeled off or being peeled off from the surface of the rotary table 12 is blown off by the blown purge gas. Furthermore, by stopping the supply of the purge gas, the blown SiN film is captured and exhausted by the exhaust stream flowing into the first to third exhaust ports 61 to 63. By repeating this operation twelve times, the SiN film peeled off from the upper surface of the rotary table 12 due to thermal shrinkage is captured and removed by the purge gas.

Next, at the time t3, the revolution number of the rotary table 12 is maintained, the valve V20 is opened, and the Ar gas is supplied, in which state the heaters 15 are turned on. As a result, the temperature of the rotary table 12 rises from 100 degrees C. and reaches, for example, 450 degrees C. at the time t4. Then, after the temperature of the rotary table 12 reaches 450 degrees C., the valve V20 is closed at the time t4 to stop the supply of the purge gas, and the revolution number of the rotary table 12 is reduced to 3 rpm. Thereafter, the subsequent wafers W are loaded into the film forming apparatus, and the film forming process is resumed.

According to the above-described embodiment, in the operation method of the film forming apparatus, the heaters 15 of the rotary table 12 are turned off in a state in which the wafer is not mounted on the rotary table 12, and the $H_2$ gas kept at a room temperature is supplied to the upper surface of the rotary table 12 while rotating the rotary table 12. As a result, the rotary table 12 can be rapidly cooled in a short time. Therefore, the SiN film formed on the upper surface of the rotary table 12 sharply shrinks due to the rapid cooling of the rotary table 12, and a large force acting in the horizontal direction is applied to the SiN film. Accordingly, since the SiN film is put in a state where it can be easily peeled off from the rotary table 12, blowing a purge gas toward the rotary table 12 can quickly peeled off, the SiN film. Therefore, particles generated by the SiN film adhering to the upper surface of the rotary table 12 can be suppressed, and the frequency of cleaning of the interior of the film forming apparatus can be reduced, thereby improving the throughput.

The gas supplied to lower the temperature of the rotary table 12 may be a gas used as the purge gas, in this example, a gas having a larger heat transfer coefficient than an Ar gas. For example, a gas with a small molecule such as $H_2$ or the like has a large heat transfer coefficient and a large momentum and, therefore, tends to deprive heat when blown against an object. Therefore, by blowing the $H_2$ gas, the temperature can be lowered in a short time as compared with the case of blowing an Ar gas. Accordingly, for example, a He gas, a $N_2$ gas or the like may be used as the gas blown toward the rotary table 12 for the purpose of promoting the cooling of the rotary table 12.

Further, when blowing the purge gas toward the rotary table 12, the purge gas is intermittently supplied. Therefore, when the blowing of the purge gas is temporarily stopped, the airflow obstructing the exhaust flow disappears, and the particles of the SiN film scattered by the blowing of the purge gas can be even reliably captured by the exhaust flow. Even in the case where the purge gas is not intermittently supplied but is supplied at a constant flow rate, it is possible to obtain an effect that the SiN film can be scattered and exhausted.

Further, it may be possible to quickly turn on the heaters 15 to raise the temperature of the rotary table 12, after performing a process of cooling the rotary table 12 by turning off the heaters 15 to cool down the rotary table 12 to a target temperature, i.e., 100 degrees C. in this example. For example, as shown in the sequence of FIG. 9, the removal of the accumulated SiN film is started similarly to the sequence shown in FIG. 7, and, at the time t1, the heaters 15 are turned off and the supply of the $H_2$ gas is started. Next, at the time t2 at which the temperature of the rotary table 12 reaches 100 degrees C., the supply of the $H_2$ gas is stopped and the heaters 15 are turned on. Further, the revolution number of the rotary table 12 is increased to 120 rpm and an Ar gas is intermittently supplied at intervals of 150 seconds. Even in such a configuration, the same effect can be obtained because the rotary table 12 can be rapidly cooled during the time t1 to t2.

Further, the operation method of the film forming apparatus according to the present disclosure may be carried out between the lots of the wafers W or at the start of driving of the film forming apparatus. Alternatively, the film to be formed on the rotary table 12 may be monitored by, for example, a camera, and an alarm may be issued when the film thickness reaches a predetermined film thickness. Alternatively, the operation method of the film forming apparatus may be performed after dry cleaning performed by supplying a gas for removing the SiN film into the film forming apparatus. In the case of dry cleaning, the SiN film attached to the rotary table 12 may remain. Therefore, by executing the accumulated film removal method after executing the dry cleaning of the film forming apparatus, it is easy to peel off the remaining SiN film in advance, which is more effective.

Further, in the present disclosure, the purge gas is supplied at least after the rotary table 12 has reached the second temperature. For example, as long as the temperature of the rotary table 12 reaches the second temperature, the purge gas may be supplied earlier than the time t2 shown in FIG. 7.

Further, the first temperature need not be the process temperature used for the film forming process of the wafer W. For example, the rotary table 12 may be first increased to a temperature higher than the process temperature, e.g., 600 degrees C. which is the first temperature, and may be cooled to the second temperature. With such a configuration, there is an effect that it is possible to further apply a larger temperature difference to the SiN film and to apply a larger thermal shrinkage to the SiN film. Further, the temperature at the time of film formation may include a temperature slightly raised from the set temperature of the processing atmosphere at the time of film formation, for example, a temperature raised by 20 degrees C. from the set temperature of the processing atmosphere. The expression "after the film forming process on the substrate is completed and the substrate is unloaded from the processing container" means that the film forming process is performed on the substrate, the reaction product adheres to the interior of the processing container, and the substrate does not exist in the processing container. This may include the time after maintenance.

Furthermore, in the present disclosure, apart from the gas supply/exhaust unit 2, a gas supply part for supplying a purge gas into the vacuum container 11 may be provided. In addition to the gas injectors 51 and 52 for supplying a $H_2$ gas as a modifying gas, a $H_2$ gas supply part for supplying a $H_2$ gas toward the rotary table 12 may be provided. In the above-described embodiment, the cooling gas is supplied from the two gas injectors 51 and 52. However, the cooling gas may be supplied from one of the gas injectors 51 and 52.

Second Embodiment

In the present disclosure, the film adhering to the rotary table 12 may be removed through the use of plasma. FIG. 10 shows an example of a sequence for executing an operation method of a film forming apparatus according to a second embodiment. In this example, similarly to the sequence shown in FIG. 7, the operation from the time t0 to the time t4 is performed. For example, microwaves are supplied from the plasma forming units 3A to 3C in conformity with the timing at which the Ar gas is intermittently supplied by turning on the valve V20 from the time t4.

Since the Ar gas supplied from the purge gas discharge port 23 widely spreads over the entire surface of the rotary table 12, the Ar gas is also supplied to below the plasma forming units 3A to 3C. Therefore, the Ar gas is activated into plasma under the plasma forming units 3A to 3C, which makes it possible to decompose the SiN film adhering to the rotary table 12. Thereafter, at the time t5, the supply of the purge gas is stopped, the irradiation of the microwaves is stopped, and the revolution number of the rotary table 12 is reduced to 3 rpm. Thereafter, the processing of the subsequent wafers W is started. Even in such a configuration, the film adhering to the rotary table 12 can be efficiently removed as shown in the example to be described later. Further, the present disclosure may be applied to a film forming apparatus for carrying out a film forming process by mounting a single wafer W on a mounting table provided in a vacuum container. Moreover, the present disclosure may be applied to a film forming apparatus in which a plurality of wafers W are mounted in a shelf shape in a vertical direction in a vacuum container and films are formed while heating the wafers W with a heater provided around the wafers W mounted in a shelf shape. In addition, the present disclosure may be applied to the removal of a thin film formed inside a processing container of such an apparatus. The nozzle for supplying a purge gas may be provided below the plasma forming units 3A to 3C.

Example

In order to verify the effects of the embodiments of the present disclosure, the following tests were conducted. Using the operation method of the film forming apparatus shown in the second embodiment, a film forming process was performed on a plurality of wafers W, and the number of particles adhering to the 792nd wafer W was checked. Next, after executing the operation method of the film forming apparatus according to the second embodiment shown in the sequence of FIG. 11, the film forming process of the wafer W was started. Thereafter, the number of particles adhering to the 55th wafer W (the 847th wafer in total) was checked. The same process (sample) was performed five times, and the number of particles was counted in each of the 792nd wafer W and the 847th wafer W in each sample. The number of particles was counted for particles having a diameter of 0.04 μm or more.

FIG. 11 shows the results. FIG. 11 is a characteristic diagram showing the number of particles counted in the wafer W (792nd wafer) before executing the operation method of the film forming apparatus and the wafer W (847th wafer) after executing the operation method of the film forming apparatus in samples 1 to 5. As shown in FIG. 11, in each of samples 1 to 5, 1000 particles or more were counted before executing the operation method of the film forming apparatus. In the wafer W after executing the operation method of the film forming apparatus, the number of particles was 80 or less in all the samples. Samples in which the number of particles is reduced to about 20 were also seen. According to these results, it is possible to greatly reduce the number of particles adhering to the wafer W by executing the operation method of the film forming apparatus according to the present disclosure. Therefore, it is presumed that the SiN film adhering to the rotary table 12 can be efficiently peeled off by the operation method of the film forming apparatus according to the present disclosure.

According to the present disclosure, in a film forming apparatus for performing a film forming process by supplying a film forming gas in a vacuum atmosphere, after taking out a substrate subjected to a film forming process from a processing container, the temperature inside the processing container is decreased from a first temperature to a second temperature by a cooling gas. At least after reaching the second temperature from the first temperature, a purge gas is supplied into the processing container. At this time, a gas having a heat transfer coefficient higher than that of the purge gas is used as the cooling gas. This makes it possible to rapidly lower the temperature inside the processing container. Therefore, the thin film is rapidly thermally shrunk and easily peeled off. The portion of the thin film which may be peeled off during the film forming process for the substrate is peeled off by the purge gas. Therefore, it is possible to quickly remove the particle generation source in the thin film adhering to the processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for performing a film forming process by supplying a film forming gas to a substrate in a vacuum atmosphere, comprising:
    a processing container in which a mounting part for mounting the substrate thereon is provided;
    a heating part configured to heat the substrate mounted on the mounting part;
    an exhaust part configured to evacuate an inside of the processing container;
    a cooling gas supply part configured to supply a cooling gas into the processing container;
    a purge gas supply part configured to supply a purge gas into the processing container; and
    a control part configured to output a control signal for executing a step of applying a stress to a thin film formed inside the processing container by unloading the substrate subjected to the film forming process from the processing container and then cooling the inside of the processing container from a first temperature to a second temperature by the cooling gas, a step of supplying the purge gas into the processing container to peel off the thin film at least after the inside of the processing container is cooled from the first temperature to the second temperature, and a step of exhausting the purge gas,
    wherein the cooling gas has a larger heat transfer coefficient than the purge gas.

2. The apparatus of claim 1, wherein in the step of applying the stress to the thin film, the substrate subjected to the film forming process is unloaded from the processing container, and then the inside of the processing container is cooled from the first temperature at which the film forming process is performed on the substrate to the second temperature.

3. The apparatus of claim 1, wherein the cooling gas is a hydrogen gas.

4. The apparatus of claim 1, wherein the step of supplying the purge gas into the processing container is a step of intermittently supplying the purge gas into the processing container in a state in which the inside of the processing container is evacuated.

5. The apparatus of claim 1, further comprising:
 a step of converting the purge gas into plasma to generate plasma at least after the inside of the processing chamber is cooled from the first temperature to the second temperature.

6. The apparatus of claim 1, wherein the film forming process is a process of alternately supplying a raw material gas and a reaction gas reacting with the raw material gas to generate a reaction product to the substrate.

7. The apparatus of claim 6, wherein the mounting part is a rotary table for revolving the substrate mounted on an upper surface thereof, and
 a raw material gas supply region to which the raw material gas is supplied and a reaction gas supply region to which the reaction gas is supplied are arranged on the rotary table along a rotation direction of the rotary table so as to be spaced apart from each other.

8. An operation method of a film forming apparatus for performing a film forming process by supplying a film forming gas to a substrate in a vacuum atmosphere, comprising:

applying a stress to a thin film formed inside a processing container by unloading the substrate subjected to the film forming process from the processing container and then cooling the inside of the processing container from a first temperature to a second temperature by a cooling gas;

supplying a purge gas into the processing container to peel off the thin film at least after the inside of the processing container is cooled from the first temperature to the second temperature; and exhausting the purge gas, wherein the cooling gas has a larger heat transfer coefficient than the purge gas.

9. The operation method of claim 8, wherein the cooling gas is a hydrogen gas.

10. The operation method of claim 8, wherein the processing container includes a mounting part which is a rotary table for revolving the substrate mounted on an upper surface thereof,
 wherein a raw material gas supply region to which a raw material gas is supplied and a reaction gas supply region to which a reaction gas reacting with the raw material gas to generate a reaction product is supplied are arranged on the rotary table along a rotation direction of the rotary table so as to be spaced apart from each other, and
 wherein the film forming process is performed by rotating the rotary table and allowing the substrate to alternately pass through the raw material gas supply region and the reaction gas supply region.

* * * * *

UNITED STATES PATENT AND TRADEMARK OFFICE
CERTIFICATE OF CORRECTION

PATENT NO. : 10,550,470 B2
APPLICATION NO. : 16/171667
DATED : February 4, 2020
INVENTOR(S) : Hideomi Hane et al.

It is certified that error appears in the above-identified patent and that said Letters Patent is hereby corrected as shown below:

On the Title Page

Item (72) please remove the fourth Inventor City "Niraskai" and replace with "Nirasaki"

Signed and Sealed this
Thirty-first Day of March, 2020

Andrei Iancu
*Director of the United States Patent and Trademark Office*